US011963309B2

United States Patent
Atias et al.

(10) Patent No.: US 11,963,309 B2
(45) Date of Patent: Apr. 16, 2024

(54) PROCESS FOR LAMINATING CONDUCTIVE-LUBRICANT COATED METALS FOR PRINTED CIRCUIT BOARDS

(71) Applicants: Mellanox Technologies, Ltd., Yokneam (IL); Bar-Ilan University, Ramat Gan (IL); PCB Technologies Ltd, Migdal Ha'emeq (IL)

(72) Inventors: Boaz Atias, Maale Adumim (IL); Elad Mentovich, Tel Aviv (IL); Yaniv Rotem, Nesher (IL); Doron Naveh, Petah-Tikva (IL); Adi Levi, Rosh HaAyin (IL); Yosi Ben-Naim, Eilat (IL); Yaad Eliya, Magen Shaul (IL); Shlomo Danino, Netanya (IL); Eran Lipp, Hefer (IL); Alon Rubinstein, Kfar-Yona (IL); Ran Hasson Ruso, Tel Aviv (IL)

(73) Assignees: MELLANOX TECHNOLOGIES, LTD., Yokneam (IL); BAR-ILAN UNIVERSITY, Ramat Gan (IL); PCB TECHNOLOGIES LTD., Migdal Ha'emeq (IL)

( * ) Notice: Subject to any disclaimer, the term of this patent is extended or adjusted under 35 U.S.C. 154(b) by 0 days.

(21) Appl. No.: 17/305,223

(22) Filed: Jul. 1, 2021

(65) Prior Publication Data
US 2023/0007788 A1 Jan. 5, 2023

Related U.S. Application Data

(60) Provisional application No. 63/201,910, filed on May 18, 2021.

(51) Int. Cl.
*H05K 3/46* (2006.01)
*H05K 1/02* (2006.01)
*H05K 3/06* (2006.01)

(52) U.S. Cl.
CPC ......... *H05K 3/4644* (2013.01); *H05K 1/0298* (2013.01); *H05K 3/06* (2013.01); *H05K 2203/06* (2013.01)

(58) Field of Classification Search
CPC ...... H05K 3/4644; H05K 1/0298; H05K 3/06; H05K 2203/06; Y10T 29/49126; Y10T 29/49155; B32B 27/06
See application file for complete search history.

(56) References Cited

U.S. PATENT DOCUMENTS 3,672,948 A    6/1972   Foehring
4,417,722 A   11/1983   Ishii
(Continued)

FOREIGN PATENT DOCUMENTS

| DE | 112013006022 T5 | 9/2015 |
| EP | 3723122 A1 | 10/2020 |
| WO | 2020152358 A1 | 7/2020 |

OTHER PUBLICATIONS

Steinberg et al., pending U.S. Appl. No. 18/200,314, filed May 22, 2023.
(Continued)

*Primary Examiner* — Donghai D Nguyen
(74) *Attorney, Agent, or Firm* — Moore & Van Allen PLLC; Michele M. Glessner

(57) ABSTRACT

Processes for laminating a conductive-lubricant coated Printed Circuit Board (PCB) are disclosed. An example laminated PCB may include a lamination stack that may further include a core, an adhesive layer, and at least one graphene-metal structure or at least one hexagonal Boron Nitride metal (h-BN-metal) structure. The materials of the PCB may change in accordance with the invention described herein, including the materials of the core, the materials of the conductive-lubricant coatings, or the metal layers of the conductive-lubricant-metal structures. Doping processes for
(Continued)

each change in materials used are also described herein. The conductive-lubricant of the conductive-lubricant-metal structure will promote high frequency performance and heat management within the PCB. Furthermore, a removal process of those materials post-lamination is described herein to promote protection of materials and subsequent removal of protective layers without breakage or tearing.

22 Claims, 9 Drawing Sheets

(56) References Cited

U.S. PATENT DOCUMENTS

| | | | |
|---|---|---|---|
| 4,450,034 A | | 5/1984 | Stern |
| 4,455,181 A * | | 6/1984 | Lifshin ............ H05K 3/025 |
| | | | 156/289 |
| 4,931,425 A | | 6/1990 | Kimura |
| 5,108,532 A | | 4/1992 | Thein et al. |
| 5,256,474 A * | | 10/1993 | Johnston ........... H05K 3/022 |
| | | | 428/220 |
| 6,432,239 B1 | | 8/2002 | Mandai et al. |
| 9,215,797 B2 | | 12/2015 | Mori et al. |
| 9,384,875 B2 | | 7/2016 | Kimura et al. |
| 9,431,487 B2 | | 8/2016 | Bol et al. |
| 9,924,619 B2 | | 3/2018 | Kim et al. |
| 10,022,947 B2 | | 7/2018 | Kimura et al. |
| 10,518,506 B2 * | | 12/2019 | Miyazono ............ B32B 27/06 |
| 10,717,260 B2 | | 7/2020 | Shimizu et al. |
| 11,105,567 B2 | | 8/2021 | Fan et al. |
| 2005/0112344 A1* | | 5/2005 | Redfern ............ H05K 3/0047 |
| | | | 428/211.1 |
| 2006/0042059 A1 | | 3/2006 | Satoh |
| 2010/0047447 A1 | | 2/2010 | Cook |
| 2010/0196124 A1 | | 8/2010 | Fukuma et al. |
| 2011/0076118 A1 | | 3/2011 | Kurita et al. |
| 2011/0091646 A1 | | 4/2011 | Aliatieh |
| 2011/0123776 A1 | | 5/2011 | Shin et al. |
| 2013/0189635 A1 | | 7/2013 | Lim |
| 2013/0248229 A1 | | 9/2013 | Martens |
| 2013/0299077 A1 | | 11/2013 | Hong |
| 2013/0344246 A1 | | 12/2013 | Li |
| 2014/0053973 A1 | | 2/2014 | Shin et al. |
| 2015/0064470 A1 | | 3/2015 | Kimura et al. |
| 2015/0123080 A1 | | 5/2015 | Yamaguchi |
| 2015/0360370 A1 | | 12/2015 | Mazzocco et al. |
| 2016/0027935 A1 | | 1/2016 | Naito et al. |
| 2016/0049475 A1 | | 2/2016 | Bol et al. |
| 2016/0076829 A1 | | 3/2016 | Lee et al. |
| 2016/0079001 A1 | | 3/2016 | Lin et al. |
| 2016/0093478 A1 | | 3/2016 | Guo |
| 2017/0029279 A1 | | 2/2017 | Kim |
| 2017/0125136 A1 | | 5/2017 | Park et al. |
| 2017/0130336 A1 | | 5/2017 | Fujikura |
| 2017/0207484 A1 | | 7/2017 | Zhamu et al. |
| 2017/0211706 A1 | | 7/2017 | Amir |
| 2017/0273181 A1 | | 9/2017 | Sohn et al. |
| 2017/0290167 A1 | | 10/2017 | Pun et al. |
| 2017/0338312 A1 | | 11/2017 | Treossi et al. |
| 2019/0047262 A1 | | 2/2019 | Minakuchi et al. |
| 2019/0143369 A1 | | 5/2019 | Lin et al. |
| 2019/0143656 A1 | | 5/2019 | Lin et al. |
| 2019/0145007 A1 | | 5/2019 | Lin et al. |
| 2019/0283377 A1 | | 9/2019 | Lin et al. |
| 2019/0283378 A1 | | 9/2019 | Lin et al. |
| 2019/0283379 A1 | | 9/2019 | Lin et al. |
| 2019/0284712 A1 | | 9/2019 | Lin et al. |
| 2019/0292675 A1 | | 9/2019 | Lin et al. |
| 2019/0292676 A1 | | 9/2019 | Lin et al. |
| 2019/0292720 A1 | | 9/2019 | Lin et al. |
| 2019/0292721 A1 | | 9/2019 | Lin et al. |
| 2019/0292722 A1 | | 9/2019 | Lin et al. |
| 2021/0091368 A1 | | 3/2021 | House et al. |
| 2021/0091383 A1 | | 3/2021 | House et al. |
| 2021/0100090 A1 | | 4/2021 | Chang |
| 2021/0139700 A1 | | 5/2021 | Arimoto et al. |
| 2021/0184181 A1 | | 6/2021 | Ding |
| 2021/0260859 A1 | | 8/2021 | Le Rhun et al. |
| 2022/0131040 A1 | | 4/2022 | Chen et al. |
| 2022/0161537 A1 | | 5/2022 | Quellmalz et al. |
| 2022/0169002 A1 | | 6/2022 | Honda et al. |
| 2022/0204348 A1 | | 6/2022 | Gao et al. |
| 2022/0372621 A1 | | 11/2022 | Mentovich |
| 2022/0372622 A1 | | 11/2022 | Mentovich |
| 2022/0377907 A1 | | 11/2022 | Mentovich |
| 2022/0377912 A1 | | 11/2022 | Atias |
| 2023/0002906 A1 | | 1/2023 | Mentovich |
| 2023/0007789 A1 | | 1/2023 | Mentovich |

OTHER PUBLICATIONS

Steinberg et al., pending U.S. Appl. No. 18/200,352, filed May 22, 2023.
Chinese Office Action from corresponding Chinese Application No. 202210515308.4 dated Oct. 28, 2023, 4 pages, with English Translation.

* cited by examiner

PROCESS FOR LAMINATING CONDUCTIVE-LUBRICANT COATED METALS FOR PRINTED CIRCUIT BOARDS

CROSS-REFERENCE TO RELATED APPLICATIONS

This application claims priority to U.S. Provisional Patent Application No. 63/201,910, filed May 18, 2021, the contents of which are incorporated herein by reference in their entirety.

TECHNOLOGICAL FIELD

Embodiments of the present invention relate generally to processes for laminating a conductive-lubricant coated printed circuit boards (PCBs), wherein such conductive-lubricant coatings may comprise graphene grown on a metal layer, hexagonal Boron Nitride (h-BN) grown on a metal layer, or a mixture of graphene and h-BN grown on a metal layer of the PCBs; doping the conductive-lubricant coatings before or after the growing process of the conductive-lubricant coatings on the metal layer to create a conductive-lubricant-metal layer; and removing the conductive-lubricant-metal layers from a PCB post-lamination process.

BACKGROUND

A PCB is used to electrically connect electronic components using conductive pathways, or traces, etched from metal sheets. The metal sheets are often laminated onto non-conductive materials, which may be referred to as the "core" of the PCB. For instance, a metal sheet may be comprised of copper or nickel. As the demand for higher bandwidth increases, so too does the demand for higher frequency performance, heat management of PCBs, high thermal conductivity of PCBs, and electron mobility within the PCBs.

BRIEF SUMMARY

Embodiments of the present invention provide an improved process for laminating PCBs using a conductive-lubricant coating over a metal layer, such conductive-lubricant coatings may comprise layers of graphene or hexagonal Boron Nitride (h-BN) materials. The improvements provided by embodiments of the present invention further include processes of doping the one or more conductive-lubricant coating layers, and removing one or more conductive-lubricant-metal structures (e.g., graphene-metal structures or h-BN-metal structures) from a PCB without causing tearing or damage to the underlying conductive-lubricant layer.

In some embodiments, the process for laminating conductive-lubricant coated metals for printed circuit boards may include an apparatus to apply each of the materials discussed in further detail below and carry out the processes herein described. An example apparatus may include a continuous-feed CVD system described in the application titled, CONTINUOUS-FEED CHEMICAL VAPOR DEPOSITION SYSTEM, Ser. No. 17/305,203, filed concurrently with the present application and the contents of which are hereby incorporated by reference in their entirety. Further, in some embodiments, the continuous-feed CVD system may include a substrate carrier and associated mechanisms for moving the lamination stack and printed circuit board through the continuous-feed CVD system, such as the substrate carrier and associated mechanisms described in the application titled, CVD SYSTEM WITH SUBSTRATE CARRIER AND ASSOCIATED MECHANISMS FOR MOVING SUBSTRATE THERETHROUGH, Ser. No. 17/305,206, filed concurrently with the present application and the contents of which are hereby incorporated by reference in their entirety. Further, in some embodiments, the continuous-feed CVD system may include components configured for facilitating uniform and laminar flow, such as the components described in the application titled, CVD SYSTEM WITH FLANGE ASSEMBLY FOR FACILITATING UNIFORM AND LAMINAR FLOW, Ser. No. 17/305,209, filed concurrently with the present application and the contents of which are hereby incorporated by reference in their entirety.

In some embodiments, the process for laminating conductive-lubricant coated metals for printed circuit boards may include the process for creating the graphene-coated lamination stack and printed circuit board, such as the method and product described in the application titled, PROCESS FOR LAMINATING GRAPHENE-COATED PRINTED CIRCUIT BOARDS, Ser. No. 17/305,205, filed concurrently with the present application and the contents of which are hereby incorporated by reference in their entirety. Further, in some embodiments, the process for laminating conductive-lubricant coated metals for printed circuit boards include the materials, processes, and products, such as the materials and processes described in the application titled, PROCESS FOR LOCALIZED REPAIR OF GRAPHENE-COATED LAMINATION STACKS AND PRINTED CIRCUIT BOARDS, Ser. No. 17/305,233, filed concurrently with the present application and the contents of which are hereby incorporated by reference in their entirety. Further, in some embodiments, the process for laminating conductive-lubricant coated metals for printed circuit boards include the materials and processes to create a two-dimensional-target structure (including graphene coating of such two-dimensional-target structures), such as the methods and products described in the application titled, PROCESS FOR APPLYING A TWO-DIMENSIONAL MATERIAL TO A TARGET SUBSTRATE POST-LAMINATION, Ser. No. 17/305,238, filed concurrently with the present application and the contents of which are hereby incorporated by reference in their entirety.

Example embodiments of the present invention relate generally to system(s), methods and apparatuses to provide an improved lamination process for conductive-lubricant coated metals within PCBs. The details of some embodiments of the subject matter described in this specification are set forth in the accompanying drawings and the description below. Other features, aspects, and advantages of the subject matter will become apparent from the description, the drawings, and the claims.

In accordance with some embodiments of the present invention, a method of creating a conductive-lubricant-coated PCB is provided, wherein the conductive-lubricant-coated PCB comprises a process of providing a lamination stack, wherein the process to create the lamination stack comprises providing a core; applying an adhesive layer to a top surface of the core; and attaching a conductive-lubricant-metal structure to the top surface of a core via the adhesive layer, wherein the conductive-lubricant-metal structure comprises a metal layer having at least one of a top surface of conductive-lubricant or bottom surface of conductive-lubricant; and applying a heat and a pressure to the lamination stack to form the conductive-lubricant-coated PCB.

In accordance with another aspect of the present invention, the method of creating a conductive-lubricant-coated PCB further includes the aspect wherein the metal layer of the conductive-lubricant-metal structure comprises Nickel (Ni), Copper (Cu), Platina (Pt), Cobalt (Co), Chromium (Cr), Iridium (Ir), Manganese (Mn), Tungsten (W), Silver (Ag), Ruthenium (Ru), Rhodium (Rh), Gold (Au), Molybdenum (Mo), Palladium (Pd), Gallium (Ga), Indium (In), or Tin (Sn), or any combination thereof.

In accordance with another aspect of the present invention, the method of creating a conductive-lubricant-coated PCB further includes the aspect wherein the core comprises at least one of Polyimide, liquid crystal polymer (LCP), polyester, polyurethane, bismaleimide triazine (BT), cyanate ester, fused silica, woven glass, fiber glass, microfiber glass, epoxy resin, phenol compounds, polytetrafluoroethylene (PTFE), low density polyethylene (LDPE), high density polyethylene (HDPE), polyethylene terephthalate (PET), thermoplastic polyurethane (TPU), FR4, FR408, GETEK Nelco (4000-13, 4000-13SI, 6000, 6000SI), Speedboard N, Speedboard C, Arlon 25, Rogers (Ultralam 2000, Ultralam 5000, Ultralam 6000, RO5000 series, RO6000 series, RO1200 series, RO3000 series, RO4000 series, CLTE series, DiClad series, Kappa 438, 92ML Materials, MAGTREX, TC Series, AD Series, CuClad series, IsoClad series, RT/duroid, IM series) Isola (ASTRA MT77, I-TERA MT40, IS680 AG-348, I-SPEED) Panasonic (MEGTRON7 R-5785(N), MEGTRON7 R-5785, MEGTRON6 R-5775 (N), MEGTRON6 R-5775, MEGTRON4 R-5725, MEGTRON4S R-57255, MEGTRON M R-5735, MEGTRON2 R-1577, HIPER V R-1755V), or ceramic material.

In accordance with another aspect of the present invention, the method of creating a conductive-lubricant-coated PCB further comprises doping a conductive-lubricant layer of the conductive-lubricant-metal structure by: growing the conductive-lubricant layer on the metal layer of the conductive-lubricant-metal structure; and introducing a gas to surround the conductive-lubricant-metal structure, wherein the gas comprises a dopant in gaseous form.

In accordance with another aspect of the present invention, the method of creating a conductive-lubricant-coated PCB further includes the aspect wherein the dopant in gaseous form comprises at least one of Boron (B), Nitrogen (N), Sulfur (S), or Silicon (Si).

In accordance with another aspect of the present invention, the method of creating a conductive-lubricant-coated PCB further comprises introducing ammonia ($NH_3$) into the dopant, wherein the dopant comprises N.

In accordance with another aspect of the present invention, the method of creating a conductive-lubricant-coated PCB further comprises plasma doping a conductive-lubricant layer of the conductive-lubricant-metal structure by: growing the conductive-lubricant layer on the metal layer of the conductive-lubricant-metal structure; and immersing the conductive-lubricant-metal structure in ions from plasma, wherein the plasma comprises ammonia ($NH_3$).

In accordance with another aspect of the present invention, the method of creating a conductive-lubricant-coated PCB further includes the aspect wherein the plasma further comprises at least one of hydrogen (H), Nitrogen (N), Phosphine ($PH_3$).

In accordance with another aspect of the present invention, the method of creating a conductive-lubricant-coated PCB further comprises doping a conductive-lubricant layer of the conductive-lubricant-metal structure via adsorption of small molecules by: growing the conductive-lubricant layer on the metal layer of the conductive-lubricant-metal structure; and causing a small molecule dopant to be adsorbed onto the conductive-lubricant layer of the conductive-lubricant-metal structure.

In accordance with another aspect of the present invention, the method of creating a conductive-lubricant-coated PCB further includes the aspect wherein the small molecule dopant comprises one of metal-phthalocyanine or F4TCNQ.

In accordance with another aspect of the present invention, the method of creating a conductive-lubricant-coated PCB further comprises oxide doping a conductive-lubricant layer of the conductive-lubricant-metal structure by: growing the conductive-lubricant layer on the metal layer of the conductive-lubricant-metal structure; and depositing an oxide film on the conductive-lubricant layer of the conductive-lubricant-metal structure.

In accordance with another aspect of the present invention, the method of creating a conductive-lubricant-coated PCB further includes the aspect wherein the oxide film comprises at least one of Molybdic Trioxide ($MoO_3$), Tungsten Trioxide ($WO_3$), Aluminum Oxide (AlOx), or Vanadium oxide ($VO_x$).

In accordance with another aspect of the present invention, the method of creating a conductive-lubricant-coated PCB further includes the aspect wherein the conductive-lubricant layer further comprises at least one of a graphene layer or hexagonal Boron Nitride (h-BN) layer.

In accordance with another aspect of the present invention, the method of creating a conductive-lubricant-coated PCB further includes the aspect wherein the conductive-lubricant layer further comprises at least graphene and hexagonal Boron Nitride (h-BN).

In accordance with another aspect of the present invention, the method for removing a layer of metal from a lamination stack is provided, wherein the lamination stack comprises a process of generating a lamination stack by: providing a core; applying an adhesive layer to a top surface of the core; attaching a first conductive-lubricant-metal structure to the top surface of the core via the adhesive layer, wherein the first conductive-lubricant-metal structure comprises a metal layer having at least a top surface of conductive-lubricant or a bottom surface of conductive-lubricant; and attaching a second conductive-lubricant-metal structure to a top surface of the first conductive-lubricant-metal structure, wherein the conductive-lubricant-metal structure comprises a second metal layer having at least a top surface of conductive-lubricant or a bottom surface of conductive-lubricant; applying compression and heat to the lamination stack to form a Printed Circuit Board (PCB); and displacing the bottom surface of conductive-lubricant of the second conductive-lubricant-metal structure from the top surface of conductive-lubricant of the conductive-lubricant-metal structure so as to remove the second conductive-lubricant-metal structure from the PCB.

In accordance with another aspect of the present invention, the method for removing a layer of metal from a lamination stack further includes the aspect wherein displacing the bottom surface of conductive-lubricant of the second conductive-lubricant-metal structure further comprises sliding the bottom surface of conductive-lubricant of the second conductive-lubricant-metal structure off the top surface of conductive-lubricant of the first conductive-lubricant-metal structure.

In accordance with another aspect of the present invention, the method for removing a layer of metal from a lamination stack is provided, wherein the lamination stack comprises a process of generating the lamination stack by:

providing a core; applying an adhesive layer to a top surface of the core; applying a first conductive-lubricant-metal structure to the top surface of the core via the adhesive layer, wherein the first conductive-lubricant-metal structure comprises a metal layer having at least a top surface of conductive-lubricant or a bottom surface of conductive-lubricant; applying a second conductive-lubricant-metal structure to a top surface of the first conductive-lubricant-metal structure, wherein the conductive-lubricant-metal structure comprises a second metal layer having at least a top surface of conductive-lubricant or a bottom surface of conductive-lubricant; applying heat and pressure to the lamination stack to form a Printed Circuit Board (PCB); and removing the second metal layer from the PCB.

In accordance with another aspect of the present invention, the method for removing a layer of metal from a lamination stack further includes the aspect wherein the removing of the second metal layer comprises applying a metal etchant.

In accordance with another aspect of the present invention, the method for removing a layer of metal from a lamination stack further includes the aspect wherein the removing of the second metal layer comprises mechanically polishing a top surface of conductive-lubricant of the second conductive-lubricant-metal structure.

In accordance with another aspect of the present invention, the method for removing a layer of metal from a lamination stack further includes the aspect wherein the top surface of conductive-lubricant of the second conductive-lubricant metal structure is chemically etched from the second metal layer.

BRIEF DESCRIPTION OF THE DRAWINGS

Figure 1A:
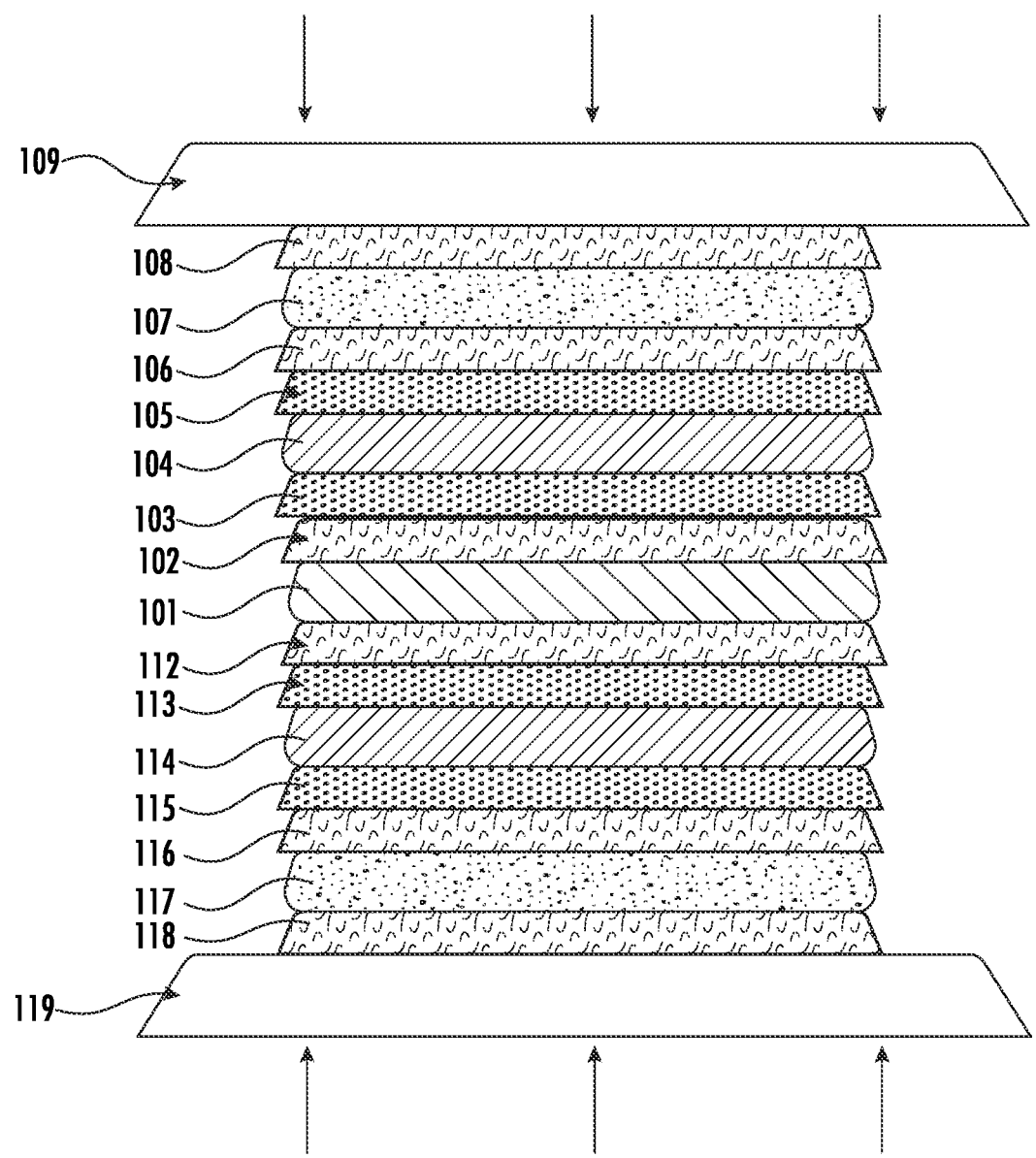
Figure 1B:
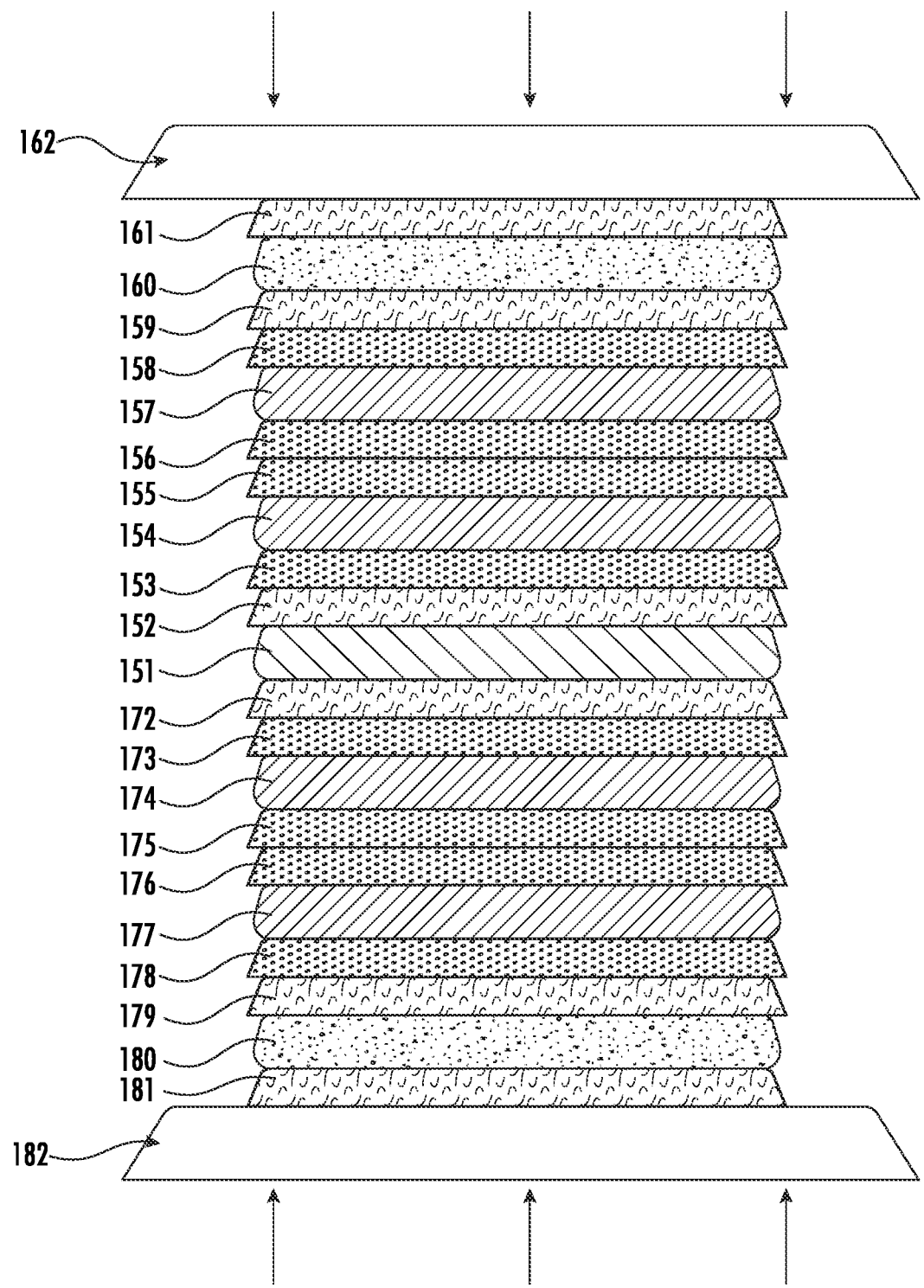
Figure 2:
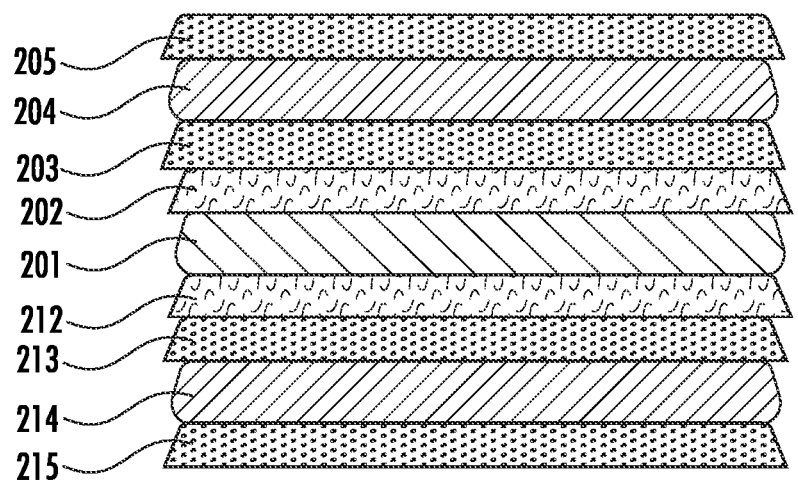
Figure 3:
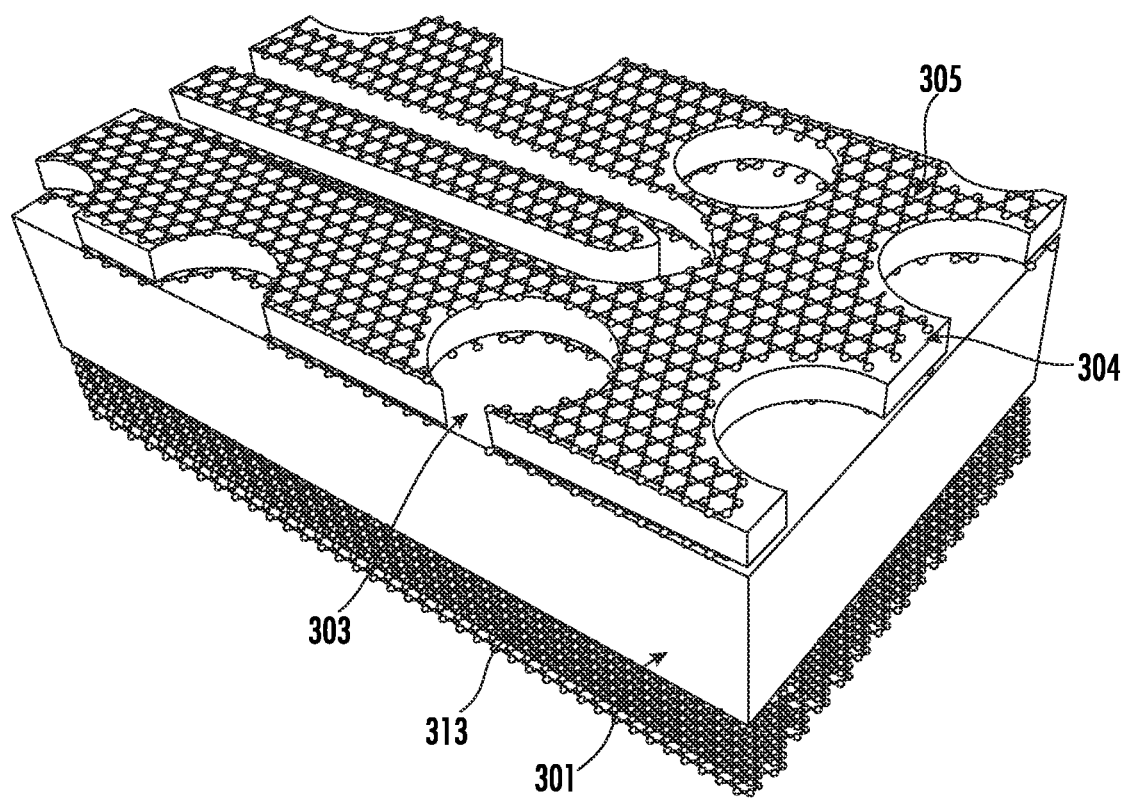
Figure 4:
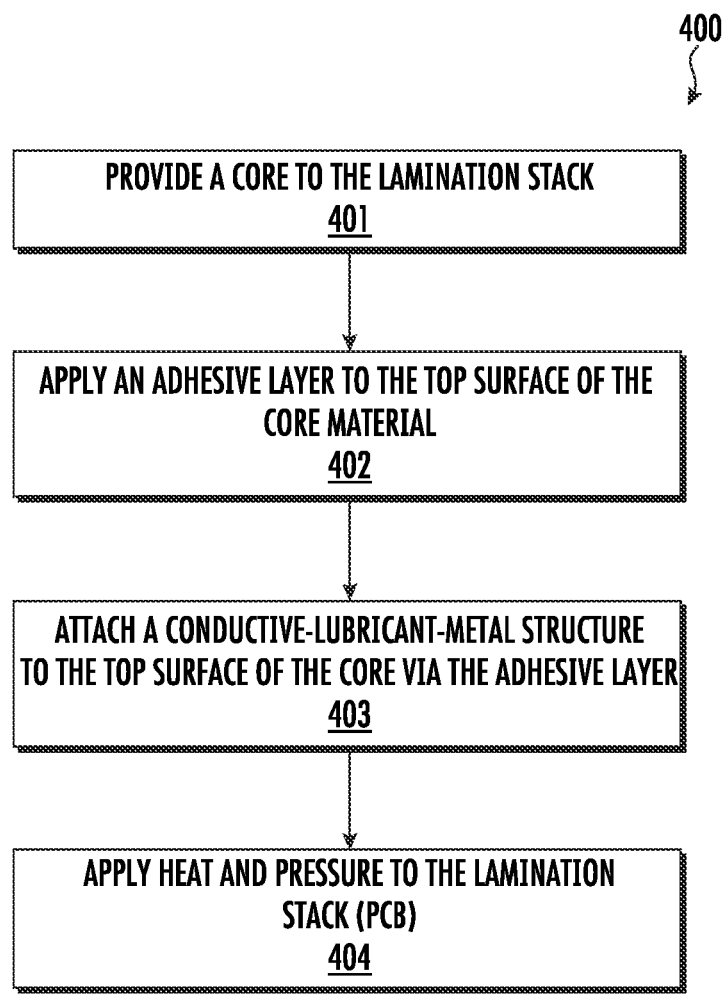
Figure 5:
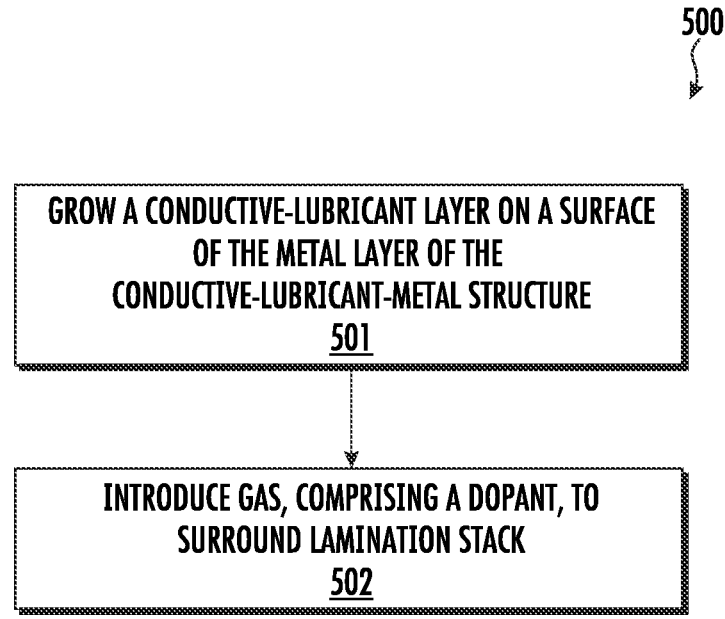
Figure 6:
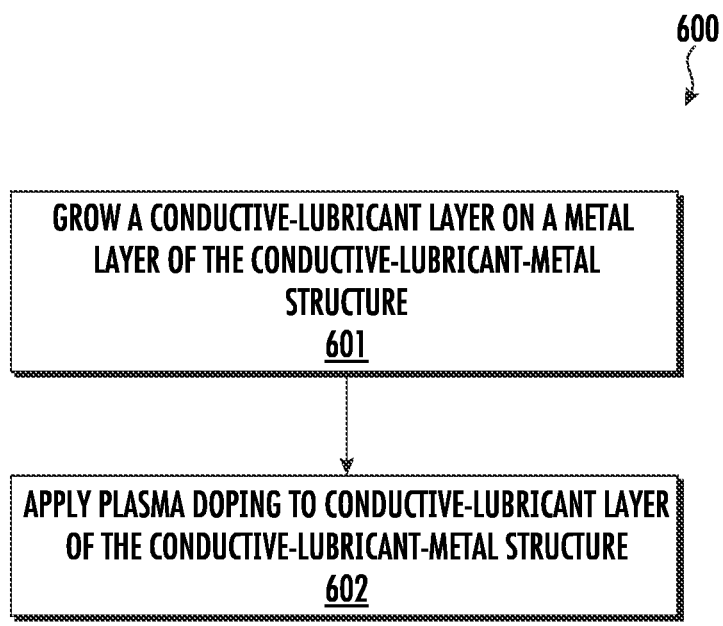
Figure 7:
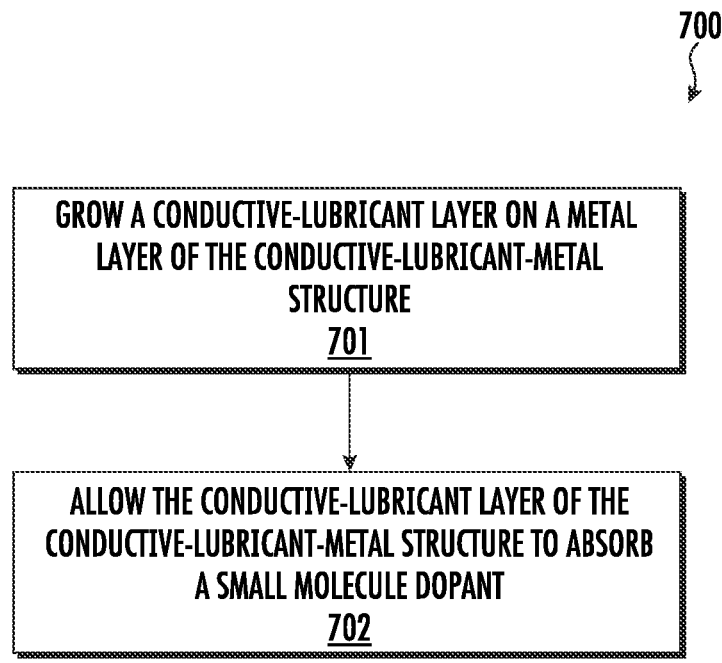
Figure 8:
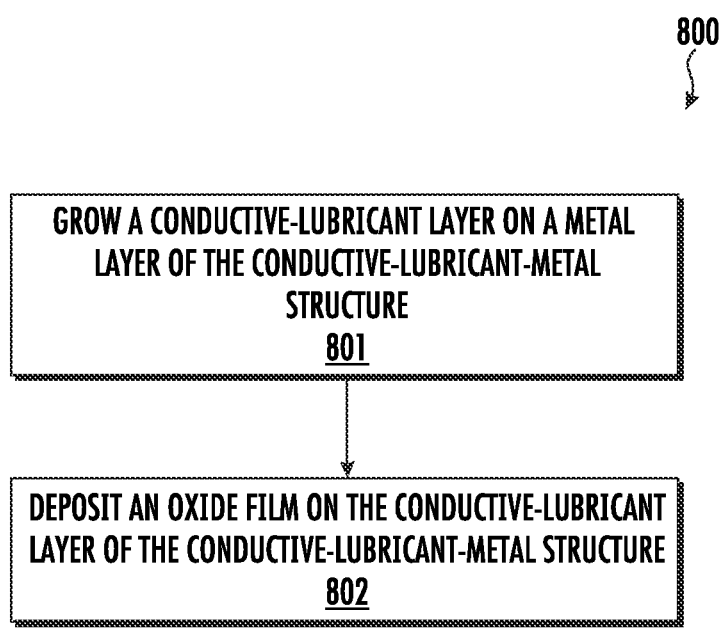
Figure 9:
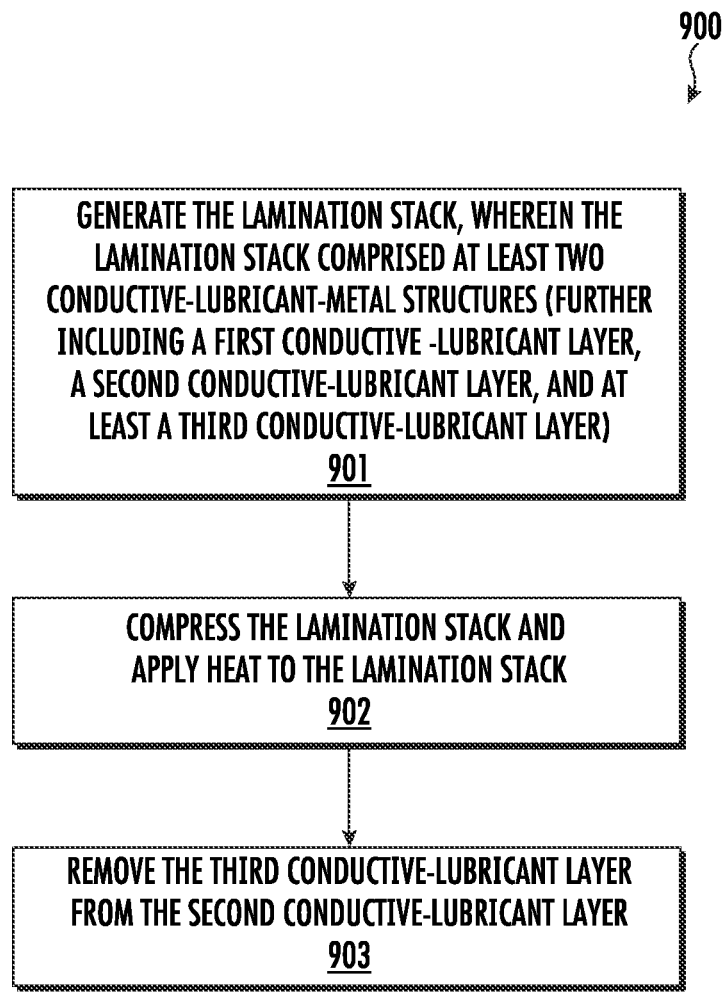
Figure 10:
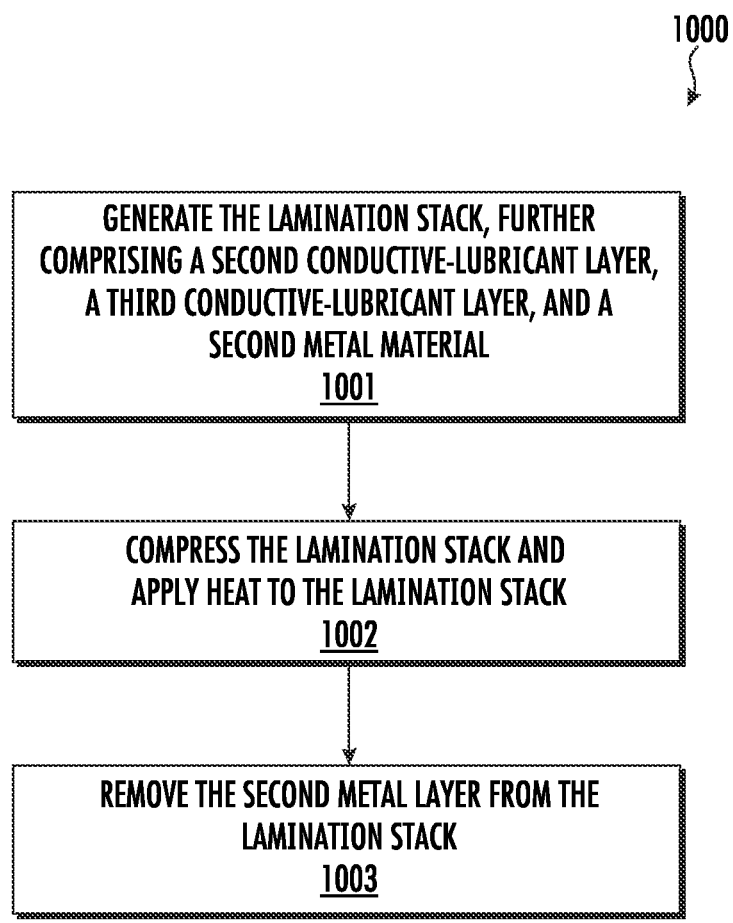

Having thus described the disclosure in general terms, reference will now be made to the accompanying drawings, which are not necessarily drawn to scale, and wherein:

FIG. 1A illustrates an exploded side view of a lamination stack associated with a PCB comprising at least a conductive-lubricant-metal structure, in accordance with one or more embodiments of the present invention;

FIG. 1B illustrates an exploded side view of a lamination stack associated with a PCB comprising at least a conductive-lubricant-metal structure, in accordance with one or more embodiments of the present invention;

FIG. 2 illustrates an exploded side view of a lamination stack prior to the lamination process taking place, in accordance with one or more embodiments of the present invention;

FIG. 3 provides an example PCB, post-lamination process, rotated at a 45-degree angle, in accordance with one or more embodiments of the present invention;

FIG. 4 illustrates an example flowchart of the lamination process to create a PCB comprising a conductive-lubricant-metal structure, in accordance with one or more embodiments of the present invention;

FIG. 5 provides an example flowchart of the doping process using a gaseous mixture introduced to a conductive-lubricant-metal structure, in accordance with one or more embodiments of the present invention;

FIG. 6 provides an example flowchart of the doping process by applying plasma doping to the conductive-lubricant-coating layer of the conductive-lubricant-metal structure, in accordance with one or more embodiments of the present invention;

FIG. 7 provides an example flowchart of the doping process through adsorption of small molecule dopants into the conductive-lubricant-coating layer of the conductive-lubricant-metal structure, in accordance with one or more embodiments of the present invention;

FIG. 8 provides an example flowchart of the doping process by depositing an oxide film on the conductive-lubricant-coating layer of the conductive-lubricant-metal structure, in accordance with one or more embodiments of the present invention;

FIG. 9 provides an example flowchart of the process to remove conductive-lubricant-coating layers from the post-processed PCB (post-lamination), in accordance with one or more embodiments of the present invention; and FIG. 10 provides an example flowchart of the process to remove a metal layer—of the conductive-lubricant-metal structures—from the post-processed PCB (after lamination), in accordance with one or more embodiments of the present invention.

DETAILED DESCRIPTION

Example embodiments will now be described more fully hereinafter with reference to the accompanying drawings, in which some, but not all, embodiments are shown. Indeed, the embodiments may take many different forms and should not be construed as limited to the embodiments set forth herein; rather, these embodiments are provided so that this disclosure will satisfy applicable legal requirements. Like reference numerals refer to like elements throughout. The terms "exemplary" and "example" as may be used herein are not provided to convey any qualitative assessment, but instead merely to convey an illustration of an example. As used herein, terms such as "front," "rear," "top," "inside," "outside," "inner," "outer," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

A lamination stack, generally, may be understood to be the stack of materials used to create a PCB. For example, such materials may include a non-conductive material (e.g., the core) which may further comprise dielectric properties within the core, an adhesive layer, and a conductive metal such as copper. The lamination stack may then be laminated (i.e., heated and/or pressurized) to solidify a bond between the materials to create the structure of the PCB. The metal layer (e.g., copper) may be etched to create the conductive trace of the PCB.

In the present invention, a lamination stack comprising a conductive-lubricant-metal structure, rather than just a metal layer (e.g., copper), is described to allow a PCB to have improved (high) frequency performance and/or improved heat management. The conductive-lubricant-metal structure may comprise such conductive-lubricant materials as one or more layers of graphene or one or more layers of hexagonal Boron Nitride (h-BN). The conductive-lubricant-metal structure is arranged on or around the core of the PCB. An adhesive layer may be used to attach the conductive-lubricant-metal structure to the core of the lamination stack at the pre-processing stage (pre-lamination) of the PCB. By adding a conductive-lubricant-metal structure to a lamination stack, where traditionally only a metal layer is placed on the lamination stack, the PCB is imbued with improved properties over a conventional PCB. For instance, the inclusion of graphene improves heat management because of its high heat conductivity properties, promotes higher electrical conductivity, low friction, and higher electron mobility, without having to make allowances for increased thickness on a PCB (graphene is extremely thin as a monolayer and additional layers). Similarly, the addition of h-BN promotes higher thermal conductivity and low friction, without having to make allowances for increased thickness on a PCB (h-BN, like graphene, is extremely thin as a monolayer or multiple layers).

With reference to FIG. 1A, a core 101 is provided as the non-conductive material of the lamination stack of the PCB. The core 101 may comprise dielectric properties. The adhesive layer(s) 102, 112 of the lamination stack may be applied directly to a surface of the core 101. The adhesive layer(s) 102, 112 may be applied to the bottom or top surface of the core 101, or both surfaces within the lamination stack. As such, one or more conductive-lubricant-metal structures (e.g., 103, 104, 105; 113, 114, 115) may be attached to a surface of the core using the adhesive layer(s) 102, 112.

In some embodiments, the conductive-lubricant-metal structure may comprise only one conductive-lubricant-coating layer and one metal layer that is attached to a surface of the core (e.g., layers 103, 104 for a bottom/inner conductive-layer-coating layer or 104, 105 for a top/outer conductive-lubricant-coating layer). The conductive-lubricant-metal structure, in those noted embodiments, may comprise a conductive-lubricant layer on the bottom surface of the metal layer (e.g., conductive-lubricant layers 103 and 104 of FIG. 1A) attached to the top surface of the core 101; a conductive-lubricant layer on the top surface of the metal layer (e.g., conductive-lubricant layers 104 and 105 of FIG. 1A) attached to the top surface of the core 101; a conductive-lubricant layer on the bottom surface of the metal layer (e.g., conductive-lubricant layers 114 and 115 of FIG. 1A) attached to the bottom surface of the core 101; a conductive-lubricant layer on the top surface of the metal layer (e.g., conductive-lubricant layers 113 and 114 of FIG. 1A) attached to the bottom surface of the core; or any combination thereof.

In yet other embodiments, the conductive-lubricant-metal structure of FIG. 1A may comprise a metal layer having a conductive-lubricant layer on both a top surface and a bottom surface of the metal layer (e.g., forming a conductive-lubricant-metal-conductive-lubricant structure 115, 114, 113; 112; 101; 102; 103, 104, 105), which is attached to the core 101. An example of such embodiment may be seen in FIG. 1A comprising a core 101, an adhesive layer 102, and a conductive-lubricant-metal structure attached via the adhesive layer to the top surface of the core (e.g., 103, 104, 105), where the conductive-lubricant-metal structure includes a bottom/inner surface of conductive-lubricant layer 103 attached to a metal layer 104, and a top/outer surface of conductive-lubricant layer 105 attached to an opposite surface of the metal layer 104. Similarly, an adhesive layer 112 is provided to attach to the core 101, and a conductive-lubricant-metal structure attached via the adhesive layer to the bottom surface of the core (e.g., 113, 114, 115), where the conductive-lubricant-metal structure includes a top/inner surface of conductive-lubricant layer 113 attached to a metal layer 114, and a bottom/outer surface of conductive-lubricant layer 115 attached to an opposite surface of the metal layer 114.

The core 101 may be comprised of certain materials including, but not limited to: Polyimide, liquid crystal polymer (LCP), polyester, polyurethane, bismaleimide triazine (BT), cyanate ester, fused silica, woven glass, fiber glass, microfiber glass, epoxy resin, phenol compounds, polytetrafluoroethylene (PTFE), low density polyethylene (LDPE), high density polyethylene (HDPE), polyethylene terephthalate (PET), thermoplastic polyurethane (TPU), FR4, FR408, GETEK Nelco (4000-13, 4000-13 SI, 6000, 6000SI), Speedboard N, Speedboard C, Arlon 25, Rogers (Ultralam 2000, Ultralam 5000, Ultralam 6000, RO5000 series, RO6000 series, RO1200 series, RO3000 series, RO4000 series, CLTE series, DiClad series, Kappa 438, 92ML Materials, MAGTREX, TC Series, AD Series, CuClad series, IsoClad series, RT/duroid, IM series) Isola (ASTRA MT77, I-TERA MT40, IS680 AG-348, I-SPEED) Panasonic (MEGTRON7 R-5785(N), MEGTRON7 R-5785, MEGTRON6 R-5775(N), MEGTRON6 R-5775, MEGTRON4 R-5725, MEGTRON4S R-57255, MEGTRON M R-5735, MEGTRON2 R-1577, HIPER V R-1755V), or ceramic.

Once the structure of the lamination stack is in place, as described above in connection with FIG. 1A, the lamination process may be performed. In particular, a frictionless substrate 106, 108, 116, and 118 may be placed between the lamination stack (comprising the core 101, at least one adhesive layer 102/112, and at least one conductive-lubricant-metal structure) and pressure pads 107 and 117 of a lamination apparatus. The pressure pads 107 and 117 may be used to apply pressure to the lamination stack at a steady rate or at varying rates so as to apply optimal pressure without creating breakage or separation of layers of the lamination stack or its components. The frictionless substrates 106, 108, 116, and 118 allow for easier removal of the lamination stack from the pressure pads 107 and 117, thereby reducing the chance for breakage by minimizing the risk of the lamination sticking to the pressure pads 107 and 117. Lastly carrier plates 109 and 119 may be used to carry the lamination stack through the lamination process (e.g., through a lamination apparatus, such as the CVD System incorporated by reference herein) which may apply the pressure with the pressure pads 107 and 117. The lamination process may further include the application of heat to melt the adhesive layer between the core and the one or more conductive-lubricant-metal structures, as described in more detail below.

In some embodiments, a lamination stack is formed that includes both top and bottom conductive-lubricant-metal structures with respect to the core. With reference to FIG. 1B, a core 151 is provided as the non-conductive material of the lamination stack of the PCB. The core may comprise dielectric properties. The adhesive layer(s) 152, 172 of the lamination stack may be applied directly to the surface of the core 151. The adhesive layer(s) 152, 172 may be applied to the bottom (172) or top surface (152) of the core 151, or both surfaces within the lamination stack.

In some cases, more than one conductive-lubricant-metal structure 153, 154, 155; 156, 157, 158 may be attached to a top surface of the core 151 using the adhesive layer 152. Moreover, in some embodiments, multiple conductive-lubricant-metal structures 173, 174, 175; 176, 177, 178 may be attached to a bottom surface of the core 151 using the adhesive layer 172. In some embodiments, the lamination stack of FIG. 1B may only comprise one conductive-lubricant-metal structure (e.g., 153, 154, 155; 156, 157, 158; 173, 174, 175; or 176, 177, 178). Or, in some embodiments, the lamination stack and PCB may comprise two conductive-lubricant-metal structures of any combination of the conductive-lubricant-metal structures herein listed (e.g., the conductive-lubricant-metal structure 153, 154, 155 may be coupled with the conductive-lubricant-metal structure 156, 157, 158; or the conductive-lubricant-metal structure 173, 174, 175 may be coupled with the conductive-lubricantmetal structure 176, 177, 178 within the lamination stack; the conductive-lubricant-metal structure 153, 154, 155 may be coupled with the conductive-lubricant-metal structure 173, 174, 175; and all other combinations of conductive-lubricant-metal structures herein listed).

With reference to FIG. 2, a core 201 is provided as the non-conductive material of the lamination stack of the PCB. The adhesive layer(s) 202, 212 of the lamination stack may be applied directly to a surface of the core 201. The adhesive layer(s) 202, 212 may be applied to the bottom (212) or top (202) surface of the core 201, or both surfaces within the lamination stack. In some embodiments, one or more conductive-lubricant-metal structure 203, 204, 205; 213, 214, 215 may be attached to a surface of the core using the adhesive layer(s) 202, 212. In some embodiments, the adhesive layer 202 or 212 is not necessary for the present invention because the conductive-lubricant-metal structure comprises material which act as an adhesive (e.g., such material may be the conductive-lubricant coating of the conductive-lubricant-metal structure).

In some embodiments, the conductive-lubricant-metal structure may comprise only one conductive-lubricant-coating layer and one metal layer when it is attached to a surface of the core 201. The conductive-lubricant-metal structure, in those noted embodiments, may comprise a conductive-lubricant layer on the bottom/inner surface of the metal layer (e.g., 203) on the top surface of the core 201; a conductive-lubricant layer on the top/inner surface of the metal layer (e.g., 213) on the bottom surface of the core 201; a conductive-lubricant layer on the top/outer surface of the metal layer (e.g., 205) on the top surface of the core 201; a conductive-lubricant layer on the bottom/outer surface of the metal layer (e.g., 215) on the bottom surface of the core 201; or any combination thereof.

In yet other embodiments, the conductive-lubricant-metal layer of FIG. 2 may comprise a metal layer having a conductive-lubricant layer on both a top surface and a bottom surface attached to the core 201. An example of such embodiment may be seen in FIG. 2 comprising a core 201, an adhesive layer 202, a bottom surface/layer of conductive-lubricant 203 attached to a metal layer 204, and a top surface/layer of conductive-lubricant 205 attached to the metal layer 204. In addition, a second conductive-lubricant-metal structure may be attached to the bottom surface of the core 201 similar to that shown in FIG. 2. For instance, the second conductive-lubricant-metal structure (e.g., 213, 214, 215) may be attached using the adhesive layer 212 to bottom surface of the core 201, wherein the top/inner surface of the metal layer comprises a conductive-lubricant layer 213; a conductive-lubricant layer on the bottom/outer surface of the metal layer 215 on the bottom surface of the core 201; or any combination thereof.

In yet other embodiments, the conductive-lubricant-metal structure of the lamination stack may only comprise one layer of conductive-lubricant on a surface of the metal layer. For instance, in FIG. 2, only a conductive-lubricant-metal structure comprising the metal layer 204 and conductive-lubricant layer 205 or 203 may have been grown on the metal layer 204. Additionally, the bottom conductive-lubricant-metal structure 213, 214, 215 attached the bottom surface of the core 201 may also only comprise a metal layer 214 and conductive-lubricant layer 213 or 215 which can be grown on the metal layer 204. Any combinations of the structure described herein may also be understood by someone of skill in the art.

With reference to FIG. 3, a PCB (post lamination process of the lamination stack) is shown. The PCB comprises the core 301; the bottom (or inside) layer of conductive-lubricant 303 of the conductive-lubricant-metal structure attached to the top surface of the core 301; the metal layer 304 of the conductive-lubricant-metal structure; the top (or outside) layer of conductive-lubricant 305 of the conductive-lubricant-metal structure attached to the opposite surface of the metal layer 304; and the one or more conductive-lubricant layers 313 attached to the bottom surface of the core 301.

After the lamination process described herein has been used to form the PCB, the conductive-lubricant-metal structure of the PCB may undergo a lithography process to outline the conductive path(s) (i.e., trace) of the PCB, then the PCB may undergo a laser ablation or chemical etching process to create the trace on the surface of the PCB following the outlined trace of the lithography process.

In some embodiments, the outline of the trace of the PCB may be made through a lithography process. The pre-designed trace (or conductive path) of the PCB may be outlined on a polymer film or polymer photomask, which may then be placed on a photo-sensitive (e.g., light-sensitive) chemical photoresist, where the photoresist was previously applied to the surface of the PCB.

In some embodiments, after the outline of the trace of the PCB is created, a laser ablation process may be used to remove unwanted material(s) from the PCB (e.g., excess conductive-lubricant-metal structure not protected by the lithography trace outline) to form the trace of the PCB. In some embodiments, the laser ablation process starts by irradiating the surface of the PCB in specific localized areas, which in turn heats the material and causes the unwanted material to evaporate in the chosen localized areas. Such materials that may be removed to create the trace of the PCB include the surrounding graphene-metal structures outside the specific outline of the trace created by the lithography process. The laser of the laser ablation process may remove the conductive-lubricant-metal structures on the surface of the PCB such that only the core is left underneath.

In some embodiments, and after the outline of the trace of the PCB is created through lithography, a chemical etching process may be used to remove unwanted material(s) from the PCB (e.g., excess conductive-lubricant-metal structure not protected by the lithography trace outline), to form the trace of the PCB. The chemical etching process of the PCB may comprise plasma etching of the conductive-lubricant layer of the conductive-lubricant-metal structure(s) using material such as argon or oxygen plasma. The chemical etching process may continue by etching the metal layer using a metal etchant (e.g., for a copper metal structure a copper etchant may be used). An example PCB after the traces have been made, either via laser ablation, chemical etching, or another known process, may be seen in FIG. 3 as the post-etched PCB.

FIG. 4 is a flowchart providing an example method 400 for forming the lamination stack in accordance with one or more embodiments of the present invention. It will be understood that each block of the flowcharts, and combinations of blocks in the flowcharts, may be implemented by various means. In some example embodiments, certain ones of the operations herein may be modified or further amplified as described below. Moreover, in some embodiments additional optional operations may also be included. It should be appreciated that each of the modifications, optional additions, or amplifications described herein may be included with the operations herein either alone or in combination with any others among the features described herein. The operations illustrated in FIG. 4 may, for example, be performed by an example apparatus (such as the CVD System incorporated by reference herein) to add each material or layer (e.g., core, adhesive layer, conductive-lubricant-metal structure, etc.) to form the PCB.

The method (e.g., method 400) may include the steps of providing a core to form the lamination stack at block 401. The core, as described supra, may comprise materials including, but not limited to: Polyimide, liquid crystal polymer (LCP), polyester, polyurethane, bismaleimide triazine (BT), cyanate ester, ceramic, polytetrafluoroethylene (PTFE), low density polyethylene (LDPE), high density polyethylene (HDPE), polyethylene terephthalate (PET), thermoplastic polyurethane (TPU), FR4, FR408, GETEK Nelco (4000-13, 4000-13SI, 6000, 6000SI), Speedboard N, Speedboard C, Arlon 25, Rogers (Ultralam 2000, Ultralam 5000, Ultralam 6000, RO5000 series, RO6000 series, RO1200 series, RO3000 series, RO4000 series, CLTE series, DiClad series, Kappa 438, 92ML Materials, MAGTREX, TC Series, AD Series, CuClad series, IsoClad series, RT/duroid, IM series) Isola (ASTRA MT77, I-TERA MT40, IS680 AG-348, I-SPEED) Panasonic (MEGTRON7 R-5785(N), MEGTRON7 R-5785, MEGTRON6 R-5775 (N), MEGTRON6 R-5775, MEGTRON4 R-5725, MEGTRON4S R-57255, MEGTRON M R-5735, MEGTRON2 R-1577, HIPER V R-1755V), or any combination thereof.

Embodiments of the method further include applying an adhesive layer to the surface (e.g., a top or bottom surface) of the core at step 402. At step 403, a conductive-lubricant-metal structure may be attached to the surface (e.g., a top or bottom surface) of the adhesive layer to attach the conductive-lubricant-metal structure to the core, before the lamination process of step 404 (heating and pressurizing of the lamination stack) takes place.

FIG. 5 is a flowchart providing an example method 500 for doping the lamination stack before or after the lamination process using a gaseous mixture, in accordance with one or more embodiments of the present invention. It will be understood that each block of the flowcharts, and combinations of blocks in the flowcharts, may be implemented by various means. In some example embodiments, certain ones of the operations herein may be modified or further amplified as described below. Moreover, in some embodiments additional optional operations may also be included. It should be appreciated that each of the modifications, optional additions, or amplifications described herein may be included with the operations herein either alone or in combination with any others among the features described herein. The operations illustrated in FIG. 5 may, for example, be performed by an example apparatus (such as the CVD System incorporated by reference herein) to add each material or layer (e.g., core, adhesive layer, conductive-lubricant-metal structure, etc.) to form the PCB.

The method (e.g., method 500) may include the steps of growing a conductive-lubricant layer on a surface of the metal layer of the conductive-lubricant-metal structure at step 501. After this growing process, and after the conductive-lubricant-metal structure has been disposed on the adhesive layer of the lamination stack, a gas may be introduced to surround the lamination stack during the lamination process at step 502. The gas may comprise a dopant such as Boron (B), Nitrogen (N), Sulfur (S), or Silicon (Si), also in gaseous form. In some embodiments, ammonia ($NH_3$) may be introduced into the dopant when the dopant is Nitrogen (N).

FIG. 6 is a flowchart providing an example method 600 for doping the conductive-lubricant layer (e.g., graphene), either before or after lamination, by immersing the lamination stack into plasma comprising Ammonia ($NH_3$), in accordance with one or more embodiments of the present invention. It will be understood that each block of the flowcharts, and combinations of blocks in the flowcharts, may be implemented by various means. In some example embodiments, certain ones of the operations herein may be modified or further amplified as described below. Moreover, in some embodiments additional optional operations may also be included. It should be appreciated that each of the modifications, optional additions, or amplifications described herein may be included with the operations herein either alone or in combination with any others among the features described herein. The operations illustrated in FIG. 6 may, for example, be performed by an example apparatus (such as the CVD System incorporated by reference herein) to add each material or layer (e.g., core, adhesive layer, conductive-lubricant-metal structure, etc.) to form the PCB.

The method (e.g., method 600) may include the steps of growing a conductive-lubricant-coating layer on a surface of the metal layer of the conductive-lubricant-metal structure at step 601. After this growing process, and either before or after the conductive-lubricant-metal structure have been disposed on the adhesive layer of the lamination stack, a Direct Current (DC) may be supplied to the lamination stack including the conductive-lubricant-metal structure within a vacuum chamber to begin the plasma doping process of step 602. The vacuum chamber may have a separate chamber for a plasma source. When the DC is powered on and off, electrons are pulled away from the plasma and ions within the plasma are exposed within the plasma as it expands from electrons being pulled away. The plasma expands, the graphene-metal structure of the lamination stack receives more ions. The plasma source may comprise materials and elements such as Ammonia ($NH_3$), hydrogen (H), or Nitrogen (N).

FIG. 7 is a flowchart providing an example method 700 for doping through absorption of small molecule dopants into the conductive-lubricant layer of the conductive-lubricant-metal structure, in accordance with one or more embodiments of the present invention. It will be understood that each block of the flowcharts, and combinations of blocks in the flowcharts, may be implemented by various means. In some example embodiments, certain ones of the operations herein may be modified or further amplified as described below. Moreover, in some embodiments additional optional operations may also be included. It should be appreciated that each of the modifications, optional additions, or amplifications described herein may be included with the operations herein either alone or in combination with any others among the features described herein. The operations illustrated in FIG. 7 may, for example, be performed by an example apparatus (not pictured) to add each material or layer (e.g., core, adhesive layer, conductive-lubricant-metal structure, etc.) to form the PCB.

The method (e.g., method 700) may include the steps of growing a conductive-lubricant layer on a surface of the metal layer of the conductive-lubricant-metal structure at step 701. After this growing process, and either before or after the conductive-lubricant-metal structure has been disposed on the adhesive layer of the lamination stack, materials comprising small molecule dopants may be deposited onto the surface of a conductive-lubricant layer of the conductive-lubricant-metal structure to start the process of step 702. Once the small molecule dopants have been deposited on the conductive-lubricant layer's surface (multiple deposits may be used for lamination stacks comprising multiple conductive-lubricant layers), the small molecule dopants may be chemically or physically adsorbed by the conductive-lubricant layer(s). The small molecule dopants may comprise 2,3,5,6-tetrafluoro7,7,8,8-tetracyanoquinodimethane (F4TCNQ); Copper (Cu); Copper Phthalocyanine (CuPC); Zinc Phthalocyanine (ZnPC); Tris(2-pyridylmethyl)amine (TPA); 9,10-dibromoanthracene (An-Br); Nitrogen Dioxide ($NO_2$); $H_2O+O_2$; Gold Trichloride ($AuCl_3$); 2,3-dichloro-5,6-dicyanobenzoquinone (DDQ); bipyridinium dichloride (BV); Sodium Amide (Na—$NH_2$); ($AnCH_3$); or any combination thereof.

FIG. 8 is a flowchart providing an example method 800 for doping process through depositing an oxide film on the conductive-lubricant layer of the conductive-lubricant-metal structure, in accordance with one or more embodiments of the present invention. It will be understood that each block of the flowcharts, and combinations of blocks in the flowcharts, may be implemented by various means. In some example embodiments, certain ones of the operations herein may be modified or further amplified as described below. Moreover, in some embodiments additional optional operations may also be included. It should be appreciated that each of the modifications, optional additions, or amplifications described herein may be included with the operations herein either alone or in combination with any others among the features described herein. The operations illustrated in FIG. 8 may, for example, be performed by an example apparatus (such as the CVD System incorporated by reference herein) to add each material or layer (e.g., core, adhesive layer, conductive-lubricant-metal structure, etc.) to form the PCB.

The method (e.g., method 800) may include the steps of growing a conductive-lubricant layer on a surface of the metal layer of the conductive-lubricant-metal structure at step 801. After this growing process, and either before or after the conductive-lubricant-metal structure has been deposited on the adhesive layer of the lamination stack, an oxide film may be deposited on the conductive-lubricant layer of the conductive-lubricant-metal structure to start the process of step 802. In some embodiments, the oxide film may be deposited onto the conductive-lubricant layer by sputter deposition by ejecting the oxide film material onto the conductive-lubricant layer. The oxide film may then adhere to the conductive-lubricant layer to create a thin layer of oxide film to cover the entire surface of the conductive-lubricant for which it has been deposited. In some embodiments, the oxide film may comprise metal oxide film, further comprising molybdenum trioxide ($MoO_3$).

In Reference to FIGS. 1B and 9-10, a process to remove a second conductive-lubricant-metal structure from a first conductive-lubricant-metal structure and a process to remove a second metal layer within a second conductive-lubricant-metal structure is described. The top-most or bottom-most conductive-lubricant-metal structures—156, 157, 158 and 176, 177, 178 of FIG. 1B, respectively—may be used as a frictionless material between the conductive-lubricant layers. For instance, a conductive-lubricant layer placed adjacent to another conductive-lubricant layer comprises a frictionless surface between the two conductive-lubricant layers such that the layers may easily be removed from each other. Thus, even after the lamination process described herein, if the top-most or bottom-most conductive-lubricant-metal structures need to be removed, the top-most and bottom-most conductive-lubricant-metal structures may be removed without any structural damage to the PCB. In some embodiments, the top-most or bottom-most conductive-lubricant-metal structures—156, 157, 158 and 176, 177, 178 of FIG. 1B, respectively—may be placed (post-removal) on another substrate and be recycled for use on another substrate if there is no damage to the top-most 156, 157, 158 or bottom-most metal structures 176, 177, 178.

The method (e.g., method 900) may include the steps of generating the lamination stack at step 901, compressing the lamination stack and applying heat to the lamination stack at 902, and removing a second layer of conductive-lubricant-metal structure post-lamination process without damaging the first conductive-lubricant-metal structure layer at 903.

In other embodiments, more conductive-lubricant-metal structures may be added such that a third conductive-lubricant-metal structure may be placed adjacent to the top-most and bottom-most conductive-lubricant-metal structures shown in FIGS. 1B, 156, 157, 158 and 176, 177, 178, respectively. Such embodiments would then have three conductive-lubricant-metal structures (not pictured) on either, or both, the top surface of the core 151 and the bottom surface of the core 151. Further, additional conductive-lubricant-metal structures beyond the three layers described herein may be used, especially for the purpose of increasing trace surface area without increasing the length and width of the PCB. In such embodiments, a conductive material may be placed between the metal layers for each PCB comprising multiple conductive-lubricant-metal structures to connect the multiple metal layers after they have been traced to create a conductive pathway. Such a conductive material may be comprised in holes drilled through the conductive-lubricant-metal structures of the PCBs, such that the conductive material may fill those holes and connect portions of the trace on one conductive-lubricant-metal structure to portions of a trace on a second conductive-lubricant-metal structure (or third-metal structure).

The method (e.g., method 1000) may include the steps of generating the lamination stack at step 1001, compressing the lamination stack and applying heat to the lamination stack at 1002, and removing a second metal layer of a second conductive-lubricant-metal structure post-lamination process without damaging the first conductive-lubricant-metal structure layer at 1003. The second metal layer may be removed through chemical etching (e.g., chemical etchant) or physical etching (e.g., scraping), to leave the lower/inner layer of conductive-lubricant of the second conductive-lubricant-metal structure (e.g., 156 or 176 of FIG. 1B) for the purpose of having increased heat insulation and electron mobility.

Many modifications and other embodiments of the present inventions set forth herein will come to mind to one skilled in the art to which these inventions pertain having the benefit of the teachings presented in the foregoing descriptions and the associated drawings. Therefore, it is to be understood that the present inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

The invention claimed is:

1. A method of creating a conductive-lubricant-coated PCB comprising:
   providing a lamination stack, wherein the process to create the lamination stack comprises:
      providing a core;
      applying an adhesive layer to a top surface of the core;
      attaching a conductive-lubricant-metal structure to the top surface of the core via the adhesive layer, wherein the conductive-lubricant-metal structure comprises a metal layer having at least one of a top surface of conductive-lubricant or a bottom surface of conductive-lubricant;
      plasma doping a conductive-lubricant layer of the conductive-lubricant-metal structure by growing the conductive-lubricant layer on the metal layer of the conductive-lubricant-metal structure and immersing the conductive-lubricant-metal structure in ions from plasma, wherein the plasma comprises ammonia ($NH_3$); and
   applying a heat and a pressure to the lamination stack to form the conductive-lubricant-coated PCB.

2. The method of claim 1, wherein the metal layer of the conductive-lubricant-metal structure comprises Nickel (Ni), Copper (Cu), Platina (Pt), Cobalt (Co), Chromium (Cr), Iridium (Ir), Manganese (Mn), Iron (Fe), Tungsten (W), Silver (Ag), Ruthenium (Ru), Rhodium (Rh), Gold (Au), Molybdenum (Mo), Palladium (Pd), Gallium (Ga), Indium (In), or Tin (Sn), or any combination thereof.

3. The method of claim 1, wherein the core comprises at least one of Polyimide, liquid crystal polymer (LCP), polyester, polyurethane, bismaleimide triazine (BT), cyanate ester, fused silica, woven glass, fiber glass, microfiber glass, epoxy resin, phenol compounds, polytetrafluoroethylene (PTFE), low density polyethylene (LDPE), high density polyethylene (HDPE), polyethylene terephthalate (PET), thermoplastic polyurethane (TPU), FR4, FR408, Speedboard N, Speedboard C, Arlon 25, laminates and bondply materials, resin systems, glass epoxy multi-layer materials, or ceramic.

4. The method of claim 1, wherein the plasma further comprises at least one of hydrogen (H), Nitrogen (N), or Phosphine ($PH_3$).

5. The method of claim 1, wherein the conductive-lubricant layer further comprises at least one of a graphene layer or hexagonal Boron Nitride (h-BN) layer.

6. The method of claim 1, wherein the conductive-lubricant layer further comprises at least graphene and hexagonal Boron Nitride (h-BN).

7. A method for removing a metal layer from a lamination stack comprising:
   generating a lamination stack by:
      providing a core;
      applying an adhesive layer to a top surface of the core;
      attaching a first conductive-lubricant-metal structure to the top surface of the core via the adhesive layer, wherein the first conductive-lubricant-metal structure comprises a first metal layer having at least a top surface of conductive-lubricant or a bottom surface of conductive-lubricant, wherein a first conductive-lubricant layer of the first conductive-lubricant-metal structure is plasma doped by growing the first conductive-lubricant layer on the first metal layer of the first conductive-lubricant-metal structure and immersing the first conductive-lubricant-metal structure in ions from plasma, wherein the plasma comprises ammonia ($NH_3$);
      attaching a second conductive-lubricant-metal structure to a top surface of the first conductive-lubricant-metal structure, wherein the second conductive-lubricant-metal structure comprises a second metal layer having at least a top surface of conductive-lubricant or a bottom surface of conductive-lubricant, wherein a second conductive-lubricant layer of the second conductive-lubricant-metal structure is plasma doped by growing the second conductive-lubricant layer on the second metal layer of the second conductive-lubricant-metal structure and immersing the second conductive-lubricant-metal structure in ions from plasma, wherein the plasma comprises ammonia ($NH_3$);
   applying compression and heat to the lamination stack to form a Printed Circuit Board (PCB); and
   removing at least a portion of the second conductive-lubricant-metal structure from the PCB.

8. The method of claim 7, wherein removing at least a portion of the second metal layer comprises applying a metal etchant.

9. The method of claim 7, wherein removing at least a portion of the second metal layer comprises mechanically polishing a top surface of conductive-lubricant of the second conductive-lubricant-metal structure.

10. The method of claim 7, wherein the top surface of conductive-lubricant of the second conductive-lubricant metal structure is chemically etched from the second metal layer.

11. The method of claim 7, wherein removing at least a portion of the second metal layer comprises removing a portion of the second conductive-lubricant metal structure including a portion of the second metal layer by applying a laser to the portion of the second conductive-lubricant metal structure.

12. The method of claim 7, wherein removing at least a portion of the second conductive-lubricant-metal structure from the PCB comprises displacing the bottom surface of conductive-lubricant of the second conductive-lubricant-metal structure from the top surface of conductive-lubricant of the first conductive-lubricant-metal structure.

13. A method of creating a conductive-lubricant-coated PCB comprising:
   providing a lamination stack, wherein the process to create the lamination stack comprises:
      providing a core;
      applying an adhesive layer to a top surface of the core;
      attaching a conductive-lubricant-metal structure to the top surface of a core via the adhesive layer, wherein the conductive-lubricant-metal structure comprises a metal layer having at least one of a top surface of conductive-lubricant or a bottom surface of conductive-lubricant;
      doping a conductive-lubricant layer of the conductive-lubricant-metal structure via adsorption of small molecules by growing the conductive-lubricant layer on the metal layer of the conductive-lubricant-metal structure and causing a small molecule dopant to be adsorbed onto the conductive-lubricant layer of the conductive-lubricant-metal structure; and
   applying a heat and a pressure to the lamination stack to form the conductive-lubricant-coated PCB.

14. The method of claim 13, wherein the small molecule dopant comprises one of metal-phthalocyanine or F4TCNQ.

15. The method of claim 13, wherein the metal layer of the conductive-lubricant-metal structure comprises Nickel (Ni), Copper (Cu), Platina (Pt), Cobalt (Co), Chromium (Cr), Iridium (Ir), Manganese (Mn), Iron (Fe), Tungsten (W), Silver (Ag), Ruthenium (Ru), Rhodium (Rh), Gold (Au), Molybdenum (Mo), Palladium (Pd), Gallium (Ga), Indium (In), or Tin (Sn), or any combination thereof.

16. The method of claim 13, wherein the core comprises at least one of Polyimide, liquid crystal polymer (LCP), polyester, polyurethane, bismaleimide triazine (BT), cyanate ester, fused silica, woven glass, fiber glass, microfiber glass, epoxy resin, phenol compounds, polytetrafluoroethylene (PTFE), low density polyethylene (LDPE), high density polyethylene (HDPE), polyethylene terephthalate (PET), thermoplastic polyurethane (TPU), FR4, FR408, Speedboard N, Speedboard C, Arlon 25, laminates and bondply materials, resin systems, glass epoxy multi-layer materials, or ceramic.

17. A method for removing a metal layer from a lamination stack comprising:
generating a lamination stack by:
providing a core;
applying an adhesive layer to a top surface of the core;
attaching a first conductive-lubricant-metal structure to the top surface of the core via the adhesive layer, wherein the first conductive-lubricant-metal structure comprises a first metal layer having at least a top surface of conductive-lubricant or a bottom surface of conductive-lubricant, wherein a first conductive-lubricant layer of the first conductive-lubricant-metal structure is doped via adsorption of small molecules by growing the first conductive-lubricant layer on the first metal layer of the first conductive-lubricant-metal structure and causing a small molecule dopant to be adsorbed onto the first conductive-lubricant layer of the first conductive-lubricant-metal structure;
attaching a second conductive-lubricant-metal structure to a top surface of the first conductive-lubricant-metal structure, wherein the second conductive-lubricant-metal structure comprises a second metal layer having at least a top surface of conductive-lubricant or a bottom surface of conductive-lubricant, wherein a second conductive-lubricant layer of the second conductive-lubricant-metal structure is doped via adsorption of small molecules by growing the second conductive-lubricant layer on the second metal layer of the second conductive-lubricant-metal structure and causing a small molecule dopant to be adsorbed onto the second conductive-lubricant layer of the second conductive-lubricant-metal structure;
applying compression and heat to the lamination stack to form a Printed Circuit Board (PCB); and
removing at least a portion of the second conductive-lubricant-metal structure from the PCB.

18. The method of claim 17, wherein removing at least a portion of the second conductive-lubricant-metal structure from the PCB comprises displacing the bottom surface of conductive-lubricant of the second conductive-lubricant-metal structure from the top surface of conductive-lubricant of the first conductive-lubricant-metal structure.

19. The method of claim 17, wherein removing at least a portion of the second metal layer comprises applying a metal etchant.

20. The method of claim 17, wherein removing at least a portion of the second metal layer comprises mechanically polishing a top surface of conductive-lubricant of the second conductive-lubricant-metal structure.

21. The method of claim 17, wherein the top surface of conductive-lubricant of the second conductive-lubricant metal structure is chemically etched from the second metal layer.

22. The method of claim 17, wherein removing at least a portion of the second metal layer comprises removing a portion of the second conductive-lubricant metal structure including a portion of the second metal layer by applying a laser to the portion of the second conductive-lubricant metal structure.

\* \* \* \* \*